(12) United States Patent
Ida et al.

(10) Patent No.: US 6,509,061 B1
(45) Date of Patent: *Jan. 21, 2003

(54) APPARATUS FOR DEPOSITING A MATERIAL BY EVAPORATION ON LARGE SURFACE SUBSTRATES

(75) Inventors: Michel Ida, Voreppe (FR); Aimé Perrin, Sr Ismier (FR); Michel Borel, St Vincent de Mercuze (FR); Raymond Charles, St Jean de Moirans (FR)

(73) Assignee: Commissariat a l'Energe Atomique, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/931,000

(22) PCT Filed: Apr. 23, 1996

(86) PCT No.: PCT/FR96/00616

§ 371 (c)(1),
(2), (4) Date: Oct. 21, 1997

(87) PCT Pub. No.: WO96/34123

PCT Pub. Date: Oct. 31, 1996

(30) Foreign Application Priority Data

Apr. 24, 1995 (FR) .............................. 95 04873

(51) Int. Cl.$^7$ .............................. C23C 14/00
(52) U.S. Cl. ................ 427/255.5; 118/726; 118/729; 118/730
(58) Field of Search ............... 118/715, 726, 118/729, 730; 156/345; 204/298.01; 438/689; 427/248.1, 255.5

(56) References Cited

U.S. PATENT DOCUMENTS

| | | | | | |
|---|---|---|---|---|---|
| 3,244,557 A | * | 4/1966 | Chiou | .............. | 118/726 |
| 3,853,091 A | * | 12/1974 | Christensen | ............ | 118/726 |
| 4,646,680 A | * | 3/1987 | Maki | .............. | 118/726 |
| 4,681,773 A | * | 7/1987 | Bean | .............. | 118/726 |
| 5,106,346 A | * | 4/1992 | Locher | ............ | 118/730 |
| 5,133,286 A | * | 7/1992 | Chco | .............. | 118/726 |
| 5,265,189 A | * | 11/1993 | Schoenherr | ........ | 118/726 |
| 5,334,302 A | | 8/1994 | Kubo et al. | | |
| 5,518,548 A | * | 5/1996 | Ramberg | .......... | 118/726 |

FOREIGN PATENT DOCUMENTS

| | | |
|---|---|---|
| EP | 0 471 144 | 3/1991 |
| EP | 0 564 028 | 3/1993 |
| FR | 2 593 953 | 1/1986 |
| FR | 2 663 462 | 6/1990 |
| FR | 2 701 601 | 2/1994 |
| JP | 1152265 | 6/1989 |
| JP | 3134164 | 7/1991 |
| JP | 4285157 | 9/1992 |

* cited by examiner

Primary Examiner—Richard Bueker
(74) Attorney, Agent, or Firm—Oblon, Spivak, McClelland, Maier & Neustadt, P.C.

(57) ABSTRACT

An apparatus for depositing a material by evaporation on a substrate having a large surface. The apparatus includes an enclosure in which are placed a number of material evaporation sources. It also includes a device for channeling or piping of vapors emitted by the sources toward the substrate during evaporation. This is formed by walls or covers which define compartments within the enclosure, each evaporation source being placed in a compartment. The apparatus can also utilize a device for moving the substrate in order to improve the uniformity of the deposit.

18 Claims, 13 Drawing Sheets

APPARATUS FOR DEPOSITING A MATERIAL BY EVAPORATION ON LARGE SURFACE SUBSTRATES

BACKGROUND OF THE INVENTION

1. Field of the Invention

The present invention relates in general terms to the deposition of material by evaporation on a substrate having a large size. One application is the production of microtip or microdot electron sources using field effect electron emission, said sources being of large size. Said electron sources are e.g. used in field emission-excited cathodoluminescence display means and in particular in flat screens of large size (approximately 1 m²).

2. Discussion of the Background

A microtip emissive system and its production process are e.g. described in detail in FR-A-2 593 953 of Jan. 24, 1986 and in FR-A-2 663 462 of Jun. 13, 1990. Firstly a description will be given of the known procedure for producing such microtips in a structure of this type, such as can be gathered from the aforementioned document by referring to the enclosed FIGS. 1, 2 and 3.

FIG. 1 shows an already produced structure having on a substrate 6 surmounted by an insulator 7, a system of cathode conductors 8, a resistive layer 9, grids 10a superimposed in crossed manner with an intermediate insulator 12 and a layer 23, e.g. of nickel, deposited on the surface to serve as a mask during the microtip production operations. This nickel layer 23, the grids 10a and insulator 12 are perforated by holes 16, in whose bottom is to be deposited the future microtips constituted by a conductive metal electrically connected to the cathode electrode 8 across the resistive layer 9.

The following procedure is taken in the production of microtips and is illustrated in FIG. 2. Firstly, e.g. deposition takes place of a molybdenum layer 18a on the complete structure. Said layer 18a has a thickness of approximately 1.8 μm. It is deposited under normal incidence with respect to the surface of the structure. This deposition procedure makes it possible to obtain molybdenum cones 18 housed in holes 16 having a height of 1.2 to 1.5 μm. This is followed by the selective dissolving of the nickel layer 23 by an electrochemical process so as to free, as shown in FIG. 3, perforated grids, e.g. of niobium 10a, so as to bring about the appearance of the electron emitting microtips 18.

To within a few technological variants, the aforementioned known method described relative to FIGS. 1, 2 and 3 is still that which is used for producing the microtips of emissive cathode systems.

The stage of depositing the molybdenum layer 18a conventionally takes place by evaporation of molybdenum heated in a crucible and condensation of the molybdenum vapour on the substrate covered with the stacked structure 7, 8, 9, 12, 10 and 23, perforated with holes 16.

In order to obtain tips 18 in holes 16, the vapour must arrive under a quasi-normal incidence on the surface of the aforementioned structure, e.g. under an angle between θ=0 (normal incidence) and $\theta_{max}$=9°. Otherwise the evaporated material may cover the walls of the holes 16 and create short-circuits between the electrodes 10a and the layers 8 and 9, or may fill said holes without creating tips.

A conventional evaporator is illustrated in FIG. 4. The material to be evaporated is heated in a source crucible 30. The substrates 33-1, 33-2, 33-3 are positioned on a substrate holder 31 and are rotated on themselves about an axis 34-1, 34-2, 34-3. The substrate holder 31 is positioned facing the crucible 30 and is itself rotated about the axis 34-2. Evaporation takes place in vacuo at approximately $10^{-5}$ to $10^{-6}$ mbar in an enclosure 35 pumped by an adapted pumping system 36.

In the case of the deposition of microtips, the substrate holder 31 has an appropriate shape to ensure that the substrates 33 receive the vapour in quasi-normal incidence with a maximum angle $\theta_{max}$.

This apparatus is suitable for making deposits on small or average size substrates (max a few dozen cm). However, problems arise when the size of the substrates is increased.

Thus, on considering the case of FIG. 4, where the substrate 33-2 is positioned facing the source 30 at a distance h, we then obtain $$h = \frac{\overline{AB}}{tg\theta}, \overline{AB} \text{ being the radius (or half-diagonal) of the substrate.}$$

For a substrate of 1 m diagonal and an angle $\theta_{max}$ of 9° (quasi-normal incidence), the height h is consequently $$\frac{0.5}{tg 9°} \simeq 3.16 \text{ m.}$$

The expert also knows that the vacuum evaporation rate is proportional to $1/h^2$. It is therefore of interest to reduce the distance h between the source and the substrate and a distance of 3.16 m is unacceptable for maintaining a high deposition rate.

In summarizing, as the vapour incidence angle θ is very small (a few degrees), it is virtually impossible to envisage the deposition on a substrate of 1 m diagonal, the deposition rate being much too low for an industrial process.

FR-A-2 701 601 describes a first apparatus for producing microtip sources, also known as the ICB apparatus. A crucible is heated by a heating element and the vaporized material is then partly ionized, which leads to the formation of clusters, which are accelerated. This type of apparatus is not suitable for producing deposits on substrates having a large surface.

A second apparatus is also described in said document and has a crucible provided with a plurality of nozzles through which a vapour is discharged into a vacuum tank, where it is ionized and then accelerated. In order to improve the directivity, said document proposes increasing the ratio L/r, where L is the thickness of the crucible and r the diameter of the nozzles.

However, this type of apparatus is incompatible with industrial production, particularly on large substrates. In particular, the nozzles can progressively become clogged by parasitic material deposits. If the ratio is L/r increased in order to increase the directivity, said problem becomes even more acute, because the vapours traverse the nozzles over a greater length, whilst the latter have a smaller diameter. This also leads to evaporated material flow rate variations.

Finally, the apparatuses described in the aforementioned documents involve ionization and acceleration sections and are consequently complex.

SUMMARY OF THE INVENTION

The object of the invention is to solve the aforementioned problem, i.e. to propose a simple apparatus making it possible to make deposits on large substrates and making it possible to maintain a relatively small vapour incidence angle and an adequate deposition rate for an industrial process.

To this end the invention relates to an apparatus for depositing a material by evaporation on a substrate, said apparatus being characterized in that it comprises an enclosure in which are placed n evaporation sources for the material to be deposited by evaporation and means for piping the vapours emitted by said sources towards the substrate.

The use of several sources makes it possible to decrease the distance between the evaporation source and the substrate and consequently the height of the system. Moreover, the means for channelling or piping to the substrate the vapours emitted by the sources make it possible to limit the incidence angle of the vapour which is condensed on the substrate. Thus, it is possible to simultaneously decrease the source-substrate distance and the angle of incidence of the vapour. The sources are placed directly facing the substrate and directly see the substrate or a portion thereof.

The means for piping the emitting vapours can be covers or walls separating the individual sources. The covers form compartments within the enclosure, each evaporation source being placed in a compartment. These covers or walls can be vertical.

According to a variant, the covers or walls can form cells at least partly having a truncated cone shape.

In all cases, a substrate holder makes it possible to install a substrate in the vicinity of one of the ends of the walls.

Within the scope of the present invention, a subproblem consists of improving the uniformity of the deposit on the substrate. Such uniformity problems can in particular occur as a result of the vapour piping means. Particularly when said means are in the form of covers or walls, marks defining zones masked by said means can appear on the substrate. The non-uniformity can also be due to variable deposition rates between individual points of the substrate.

In order to solve this subproblem, an apparatus according to the invention also has means for moving the substrate in such a way as to successively pass different parts of the substrate in front of the different sources. These means can produce and/or combine rotation and/or translation movements in one plane.

In particular, the movement can be a planetary rotary movement of the substrate. A planetary rotary movement of the substrate on itself and about an axis called the central axis of the evaporation system makes it possible to achieve a very good uniformity.

A combined rotation and translation movement about an axis, called the central axis of the evaporation system, advantageously limits the lateral dimensions of the evaporation system. Thus, in this case, the total surface described by the substrate is minimized.

Such a movement can be obtained by a system having two nested gears rotating in the same plane and about a fixed toothed wheel or sprocket.

According to a variant, the movement is brought about by a gear maintained at a constant distance from a fixed sprocket, a toothed belt or a chain surrounding the sprocket and the gear.

According to another aspect of the invention, the means for piping the vapours emitted by each source define, with said source, a cell, the surface swept by the moving substrate in said cell having, in a plane perpendicular to the evaporation direction in said cell, a centre of symmetry, the source being placed on an axis perpendicular to the surface swept by the substrate and passing through said centre of symmetry.

The invention also relates to a process for depositing a material by evaporation on a substrate and is characterized in that it comprises the introduction of the substrate into an enclosure of an apparatus of the type described hereinbefore and a stage of evaporating the material to be deposited on the substrate.

The problems solved by this process and its advantages correspond to the problems and advantages described hereinbefore relative to the apparatus.

Advantageously, the substrate is a substrate of an emissive microtip system, the microtips being produced by the evaporation stage.

BRIEF DESCRIPTION OF THE DRAWINGS

The invention is described in greater detail hereinafter relative to non-limitative embodiments and with reference to the attached drawings, wherein show.

DETAILED DESCRIPTION OF EMBODIMENTS OF THE INVENTION

Figure 1:
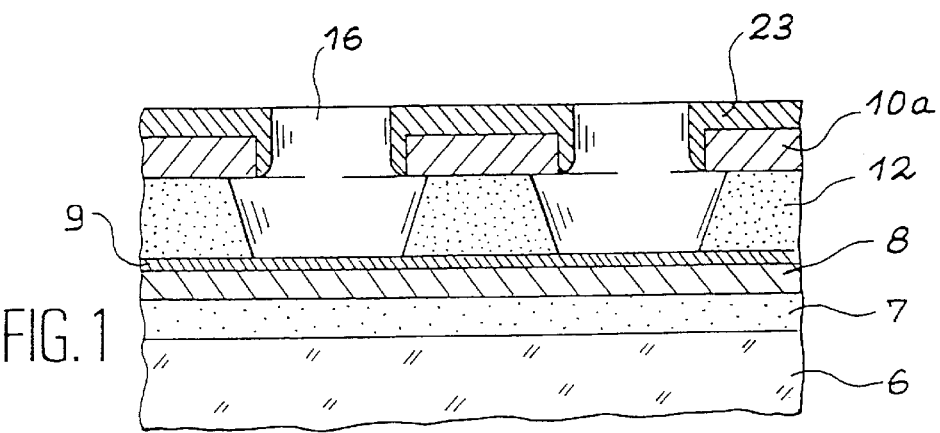
FIGS. 1 to 3 Different stages of the formation of microtips according to a prior art process.

A first embodiment of the invention will be described in conjunction with FIGS. 5A and 5B, which respectively show a plan view and a sectional view of an apparatus according to the invention.

Said apparatus essentially comprises an enclosure 43 having, in the embodiment illustrated in the drawings, an approximately square section. This enclosure is bounded by walls 52, 53, . . . , 59. This enclosure is subdivided into four compartments by walls 48, 49, 50, 51. At the bottom of each of these compartments is provided an evaporation source 40, 42, 44, 46. A surface or substrate 60 can be introduced into the top of the enclosure 43 and installed on a not shown substrate holder in such a way that the deposit surface is at a distance h from the bottom of the enclosure 43. The presence of the different vertical walls makes it possible to prevent material being evaporated on the surface of the substrate with an angle exceeding the angle $\theta_0$ shown in FIG. 5B. It is consequently possible to make a deposit with a value of the evaporation angle $\theta_0$ equal to or below a given $\theta_{max}$ and with a distance h which can be chosen in a roughly random manner, simply by choosing at the outset the height of the walls 48, 49, 50, 51 and the arrangement of the latter within the enclosure 43, their arrangement bounding surfaces of varying size of the substrate 60.

The above example is limited to four evaporation sources. It is also possible to produce an enclosure having two, three, five or more than five evaporation sources, as a function of the particular needs. The enclosure 43 is also equipped with a not shown pumping device making it possible to ensure a particular vacuum during the evaporation operation.

The enclosure described hereinbefore has vertical walls arranged perpendicular to one another and defining approximately cubic compartments. It is clear that the dimensions of the various walls can be modified, as can the distribution of compartments within the same volume of an enclosure. Thus, FIGS. 6A, 6B and 6C show various possible shapes of enclosures and different possible distributions of the walls within the enclosure.

Figure 5A:
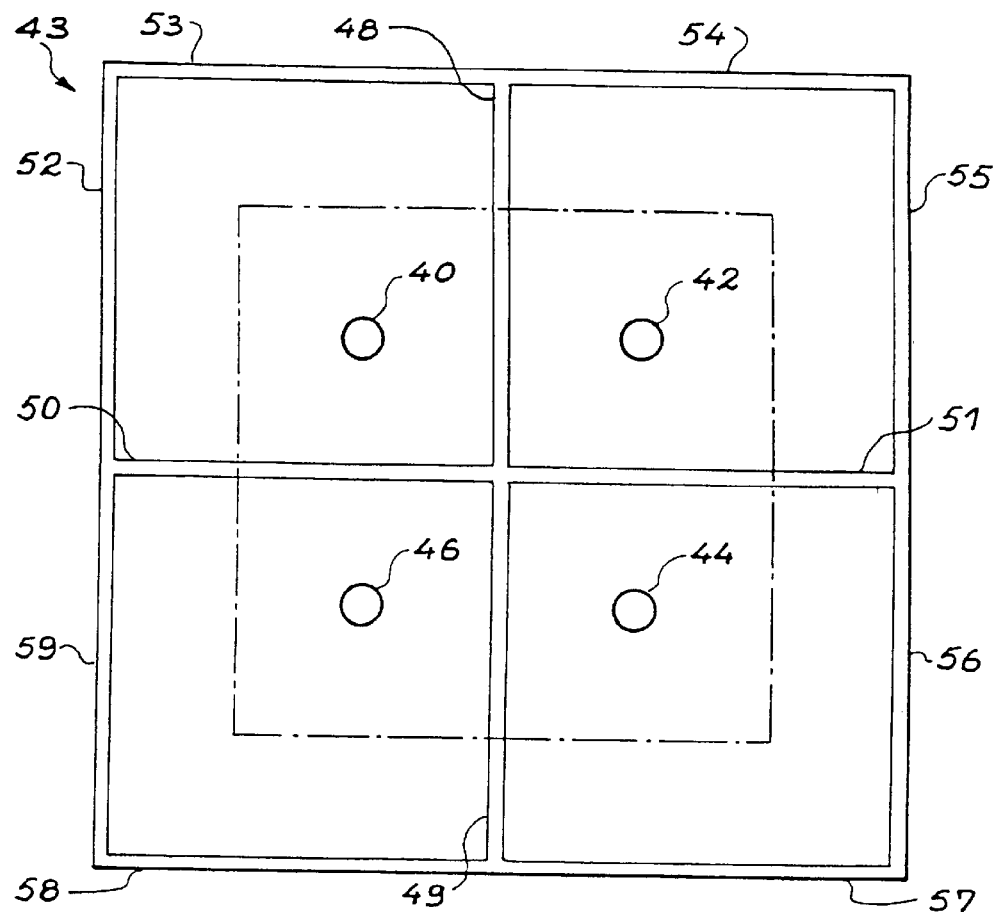
FIGS. 5A & 5B An embodiment of the invention.
Figure 5B:
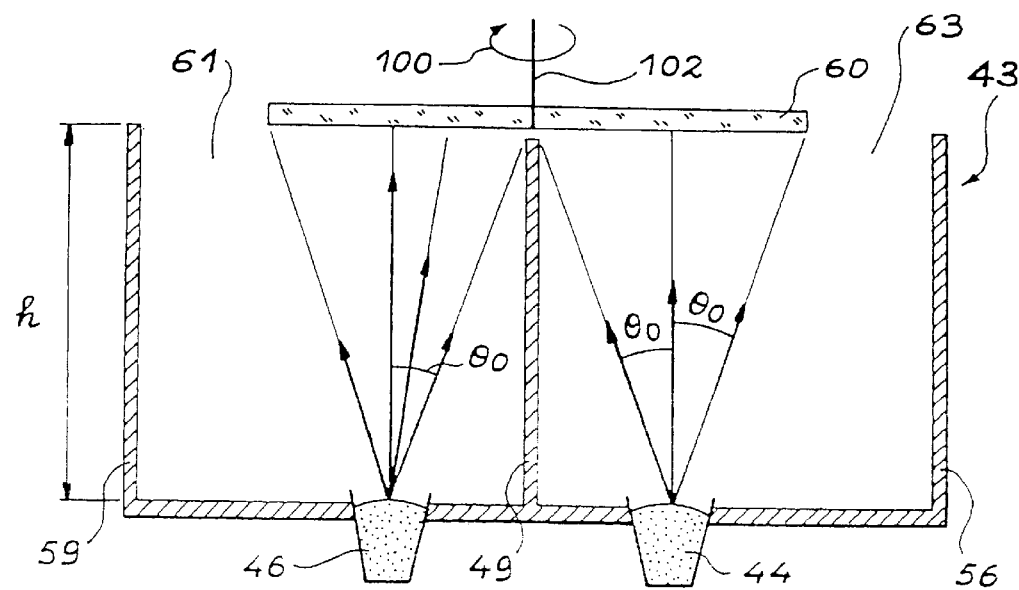
Figure 6A:
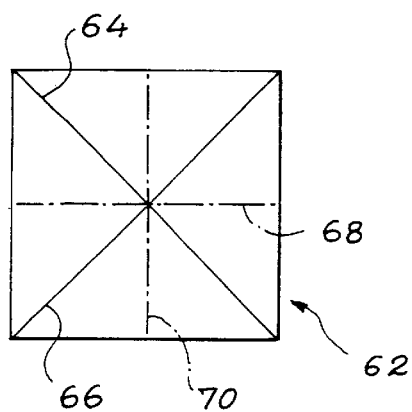
FIGS. 6A to 6C Different possible shapes for an enclosure of an apparatus according to the invention.
Figure 6B:
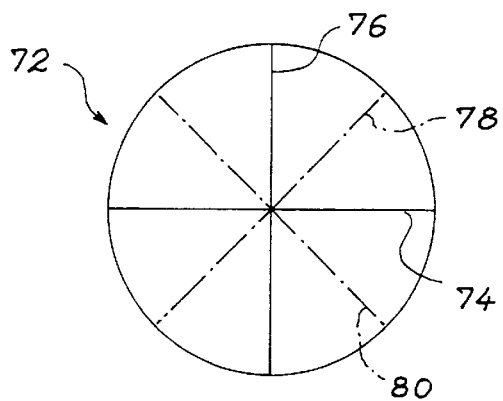

FIG. 6A is a plan view of an enclosure 62 having an external shape substantially identical to that of enclosure 43 in FIGS. 5A and 5B. In the interior, walls 64, 66 are arranged in diagonal form, an evaporation source being located at the bottom of each of the four, thus defined compartments. Eight compartments can be produced by introducing supplementary walls 68, 70 and four supplementary evapporation sources. The apparatus of FIG. 6B has an enclosure with the overall shape of a cylinder 72 and a certain number of walls 74, 76, 78, 80 defining cylindrical sectors within the enclosure 72. An evaporation source is placed at the bottom of each cylindrical sector.

Figure 6C:
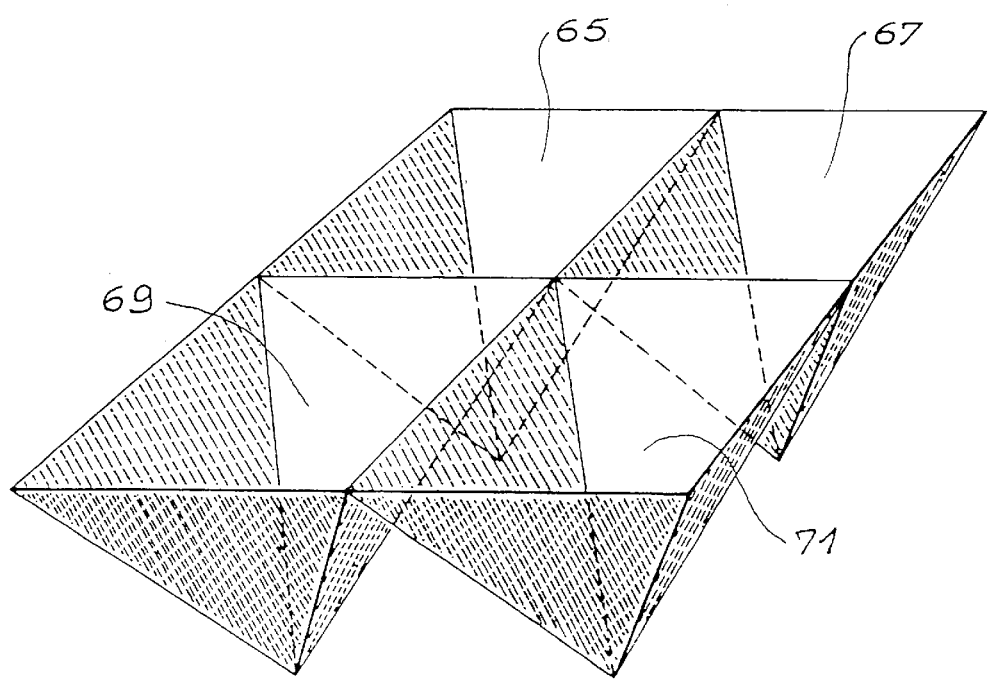

FIG. 6C shows an enclosure within which truncated cone-shaped compartments 82, 84, 86, 88 are formed, the different walls within the enclosure no longer being vertically positioned, as in the preceding examples.

More generally, the walls bounding the compartments within the enclosure can form cells having a polygonal base cylindrical symmetry (i.e. the case represented in FIGS. 5A, 6A and 6B) or cells having a partly truncated cone-shape.

In all cases, the presence of walls within the enclosure makes it possible to maintain the directivity of the vapour over the entire surface of the substrate, whilst minimizing the distance between the evaporation source and the substrate. This has the consequence of maintaining a reasonable deposition speed and therefore minimizing the time necessary for producing the deposit.

The walls or covers define in all cases compartments within the enclosure. Each source is located within a compartment. Each source has an opening 61, 63 (FIG. 5B), 65, 67, 69, 71 (FIG. 6C) in the vicinity of which the substrate is located. A substrate holder makes it possible to position the substrate in the vicinity of the openings. It can also be said that the substrate is located in the vicinity of one end of the wall.

The presence of the walls or covers can lead to a deposit which, although performed at a satisfactory speed, has uniformity defects on the substrate.

Moreover, the uniformity can be due to deposition speed variations between different points of the same substrate. For certain industrial processes, this deposition speed variation can constitute a real problem, because the total deposition time will be conditioned by the time necessary for covering areas where the deposition speed is the lowest. This has the consequence of increasing the production time and the squandering of much evaporated material. The latter is then in oversize in the high deposition speed areas and on the walls of the evaporation system.

Figure 7:
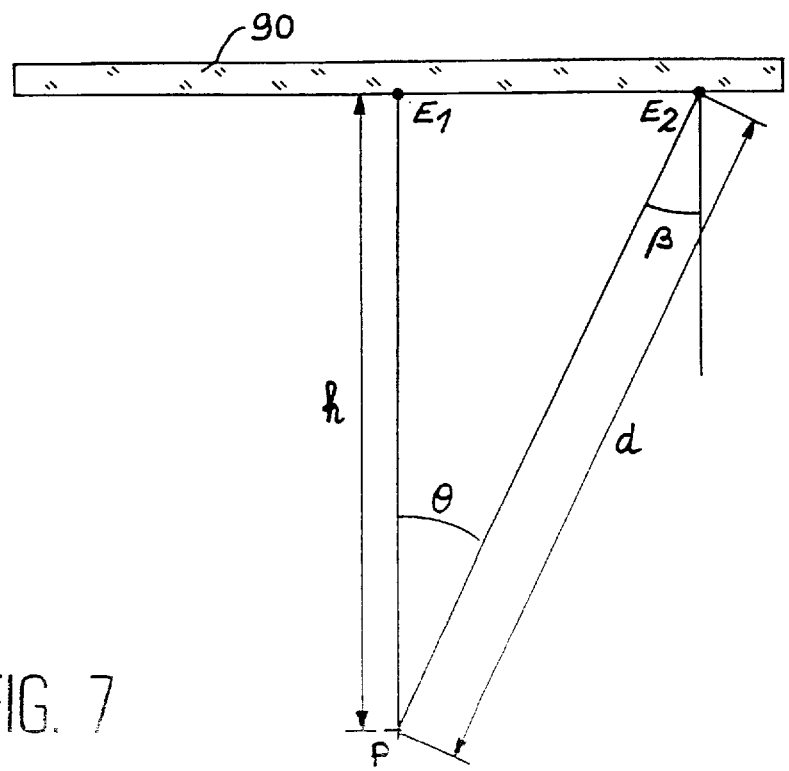
FIG. 7 Diagrammatically a punctiform evaporation source and a substrate.

It is possible to give a quantitative uniformity value between individual points of the surface on which the deposit is made by comparing th e deposition rates between these two points. For example, in the geometry illustrated in FIG. 7, it is possible to consider an approximately punctiform evaporation source located at a point P, at a distance h from the substrate 90, $E_1$ being the point of the substrate closest to the source P and $E_2$ a point of the surface at a distance d from the source, whilst β designates the angle between the line $PE_2$ and the normal to the substrate 90 at point $E_2$.

The mathematical law for vapour emission above the surface can be written in the form of a limited development in $\cos^n\theta$ (known to the expert). In practice, said development is limited to a certain number of terms as a function of the nature of the source and the charge (the charge being the material to be evaporated placed in the evaporation source crucible). For a normal evaporation with a material which does not "hollow" excessively, it is possible to limit to an emission index n=4. In calculations, it is possible to vary n from 1 to 7 in order to cover all cases.

In order to calculate the ratio of the speeds $V_2/V_1$, respectively at points $E_2$ and $E_1$, it is known that in the axis the speed decreases with the square of the distance, so that:

$$V_1 = \frac{V_0}{h^2}$$

$v_0$ being the speed level with the source P and:

$$V_2 = \frac{V_0 \cos^n\theta \cos\beta}{d_2}$$

As β=0:

$$V_2 = \frac{V_0 \cos^n\theta \cos\theta}{d_2}$$

Consequently:

$$\frac{V_2}{V_1} = h^2 \frac{\cos^n\theta \cos\theta}{d^2} = \cos^n\theta \cos\theta \cos^2\theta = \cos^{n+3}\theta$$

Thus, the uniformity varies as $\cos^{n+3}\theta$ of the evaporation angle θ. Consequently, even for an evaporation charge corresponding to n=1, the uniformity will vary as $\cos^4\theta$.

This shows that (for a fixed source-substrate distance) on increasing θ, the consequences are very significant with respect to the uniformity. The corresponding variations of the deposition time and squandered evaporated material quantity can be considerable.

In order to solve this non-uniformity problem, it is possible to improve the invention by incorporating a device making it possible to give a rotary and/or translatory movement to the substrate or substrate holder on which the substrate is mounted. In particular, this movement will take place in the plane defined by the substrate.

This movement makes it possible to improve the deposition uniformity, whilst limiting the lateral dimensions of the system. It also avoids areas masked by the covers on the substrate.

An example will be given in conjunction with FIGS. 8A and 8B, where the evaporation apparatus is identical to that described relative to FIGS. 5A and 5B. Consequently, identical numerical references will designate the same elements therein. An approximately square substrate 112 is arranged asymmetrically with respect to the different compartments.

It is firstly possible to carry out a double rotation of the substrate on itself and about the axis 102 (planetary rotation). In this case, the broadest trajectory described by one of the corners of the substrate is inscribed in a circular trajectory 104 in FIG. 8A. In this case it is necessary to use a vacuum deposition system, whose lateral dimensions make it possible to make homogeneous deposits on the entire surface limited by the circular trajectory 104.

The planetary substrate movement is a combination of a rotary substrate movement about the central axis of the system and a rotary substrate movement about an axis perpendicular to its plane (e.g. passing through its centre of symmetry if the substrate has such a centre of symmetry).

Another possible movement is a rotary-translatory movement without any rotation of the substrate on itself. To this end, the substrate holder 99 is fixed by a gear 97 in FIG. 8C in such a way that e.g. the centre of the substrate C (FIG. 8A) coincides with the centre (axis) of said gear. A fixed toothed wheel or sprocket 96 having the same diameter as the gear 97 and the same number of teeth and the same pitch between the teeth is fixed to the spindle 102 of the evaporation system. A second gear 95 having the same pitch between the teeth connects the gear of centre C to the fixed sprocket of centre 0.

The two gears 95 and 97 are connected to a support arm 98, e.g. with the aid of ball bearings, in order to ensure their mobility. Said support arm 98 rotates about the axis of the fixed sprocket 96, the drive 100 e.g. being provided with the aid of a motor.

Figure 8E:
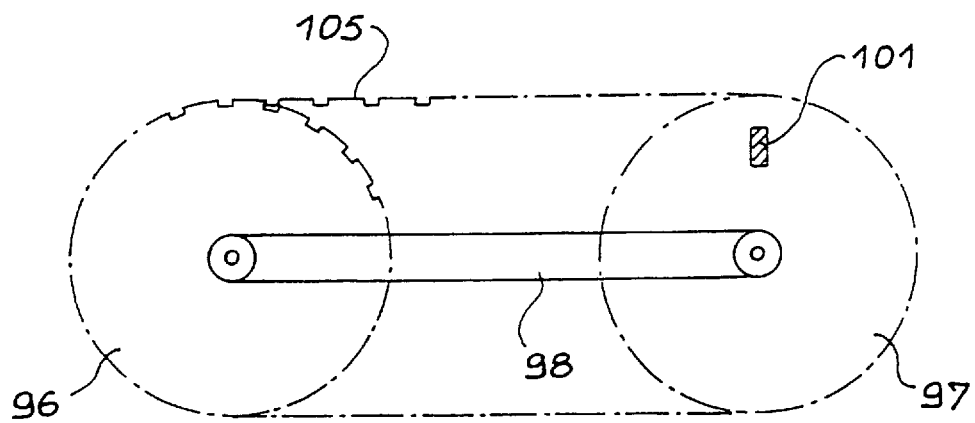
FIGS. 8A to 8E Other embodiments of the invention.
Figure 8A:
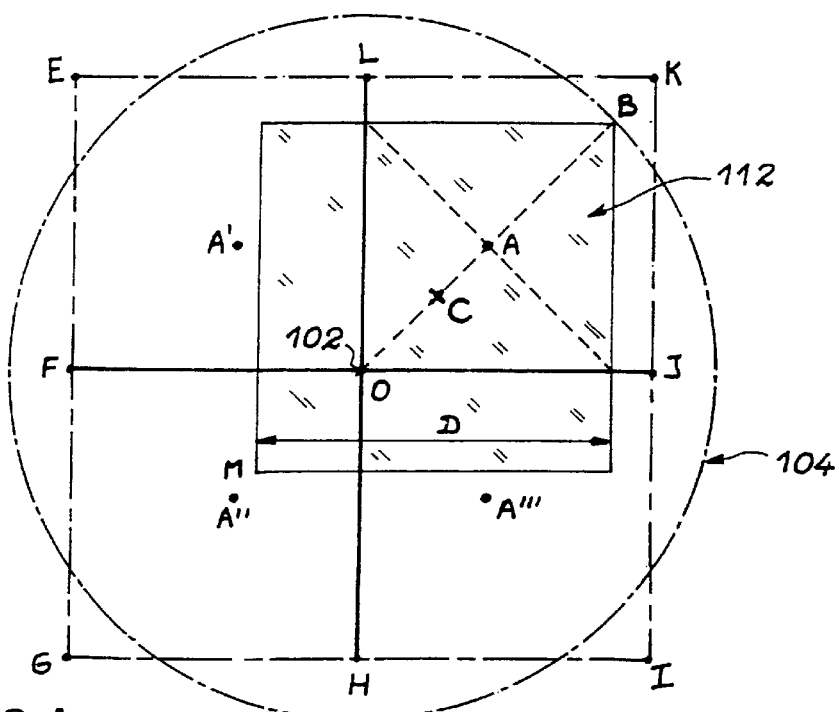
Figure 8B:
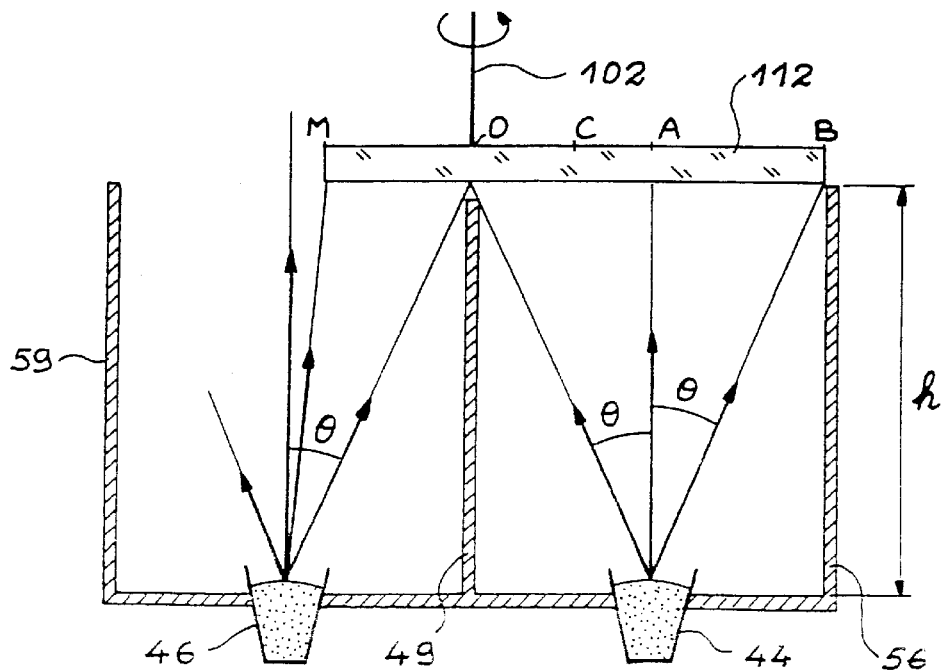

The two gears and the fixed sprocket are in the same plane. As a result of the rotation of the arm 98, the gears 95 and 96 rotate about the fixed sprocket. A rotation example is given in FIG. 8D, where arrows indicate a possible rotation direction.

As the sprocket 96 and gear 97 have the same number of teeth and the same pitch and the gear 95 has the same pitch, on plotting a mark 101 on the gear 97, said mark will be displaced while always remaining parallel to itself. Consequently there is a rotation of the centre C about point 0 without any change to the direction of the mark 101.

Figure 8C:
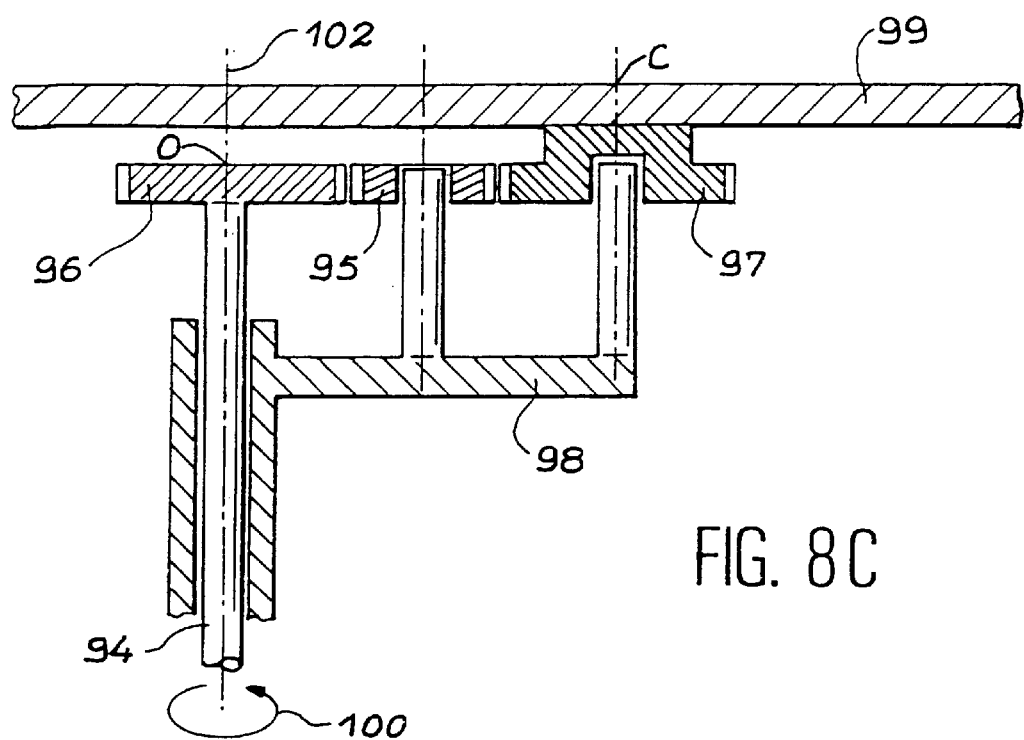
Figure 8D:
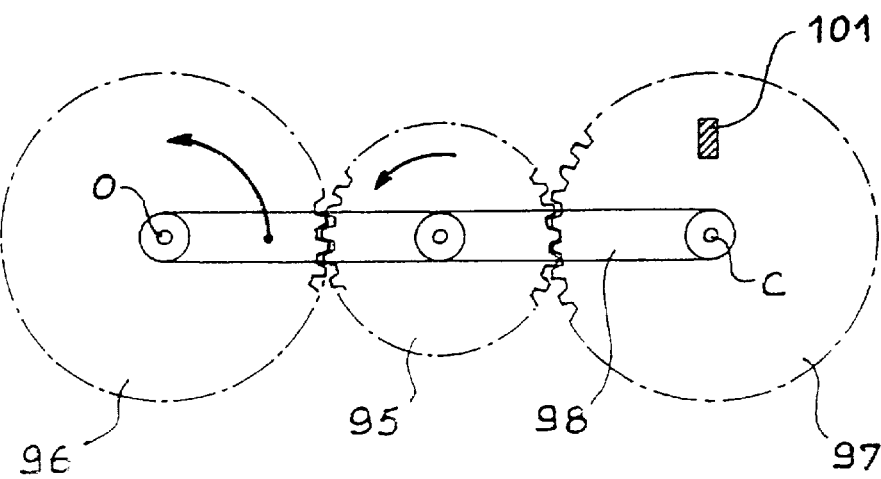

The substrate 112 is fixed to the substrate holder 99 e.g. with the aid of screws and the substrate holder 99 is fixed to the gear 97 (FIG. 8C).

Thus, this system makes it possible to drive in rotation-translation the substrate 112 about the evaporation system centre 0.

It is possible to use any other mechanical system making it possible to obtain the same movement. For example and as illustrated in FIG. 8E it is possible to eliminate the gear 95 of FIGS. 8C and 8D and replace it by a toothed belt 105 surrounding the fixed sprocket 96 and the gear 97.

The resulting movement will be the same as that described above (rotation-translation). In another example, the toothed belt could be replaced by a chain.

In FIG. 8A, the truncated corner square (EGIK) defines the space in which the substrate will evolve in the case of a rotary-translatory movement. In this case, it is clear that the necessary lateral dimensions of the evaporation system are not as large as in the case where the substrate performs a planetary rotary movement (the substrate then evolving in the circle 104).

According to another aspect of the invention and in the case where, in a cell, the surface swept by the substrate moving in said cell in a plane perpendicular to the main evaporation direction has a centre of symmetry, preferably each evaporation source will be placed in each compartment on an axis perpendicular to the surface to be coated and passing through said centre of symmetry.

If there is no centre of symmetry, as is the case in FIG. 8A, each source in each compartment will be positioned at half the maximum distance 0B corresponding to the point of the substrate 112 furthest from the centre 0.

Thus, on displacing the source from said position, it is necessary to increase the value of the height h in order to maintain the same maximum angle $\theta_{max}$ under which evaporation takes place on the substrate.

In the case of the apparatus illustrated in FIGS. 8A and 8B, in its version with a gear system making it possible to perform a rotary-translatory movement of the substrate, it is possible to evaluate the value of h as a function of the distance $\overline{OC}$ and the size of the substrate (assuming a square substrate of side D, as shown in FIG. 8A).

This gives:

$$h = \frac{\overline{OA}}{tg\theta}$$

($\theta$ being the maximum evaporation angle).

It is also possible to calculate $\overline{OA}$ as a function of the distance $\overline{OC}$, so that:

$$\overline{OA} = \frac{\overline{OB}}{2}, \overline{OB} = \overline{MB} - \overline{MO} = D\sqrt{2} - \left(\frac{D\sqrt{2}}{2} - \overline{OC}\right)$$

$$\overline{OA} = \frac{D\sqrt{2}}{2} - \frac{D\sqrt{2}}{4} + \frac{\overline{OC}}{2} = \frac{D\sqrt{2} + 2\overline{OC}}{4}$$

From this is deduced:

$$h = \frac{\overline{OA}}{tg\theta} = \frac{2\overline{OC} + D\sqrt{2}}{4tg\theta}$$

On e.g. taking a substrate of 1 m diagonal, we obtain D=0.7 m. It is e.g. decided to limit the angle of the incident vapour to $\theta=15°$ and use a system, where the distance $\overline{OC}$ between the fixed sprocket 96 and external gear 97 is 0.1 m, so that the height of such a system will be:

$$h = \frac{2 \times 0.1 + 0.7\sqrt{2}}{4tg15°} \simeq 1.11 \text{ m},$$

for an angle $\theta=9$ will be obtained h≡1.88 m.

Still in the case of a square substrate and an apparatus as described hereinbefore in conjunction with FIGS. 8A and 8B, the uniformity of the deposit can be calculated by forming the sum of the contributions of the four evaporation sources on the substrate. Calculation e.g. takes place of the ratio between the average deposition rate at one point and the average deposition rate at the centre of the square substrate.

This calculation takes place for different points along a half-diagonal of the substrate, in rotation-translation about the axis 102, without rotation on itself (cf. FIGS. 8C and 8D) and for a substrate of 1 m diagonal.

The results of these calculations are given in FIGS. 9 to 20. In each of these graphs, the graduation on the abscissa passes from 0 cm (centre of the substrate) to 50 cm (corner of the substrate). The ordinate axis represents the deposition rate ratio, the reference rate being the rate or speed at the centre of the substrate.

The curves in the same graph represent the thickness uniformity for different values of the emission index n of the source between 1 and 7. For a "normal" evaporation (material which does not hollow excessively) the value of n to be considered is n=4.

Figure 9:
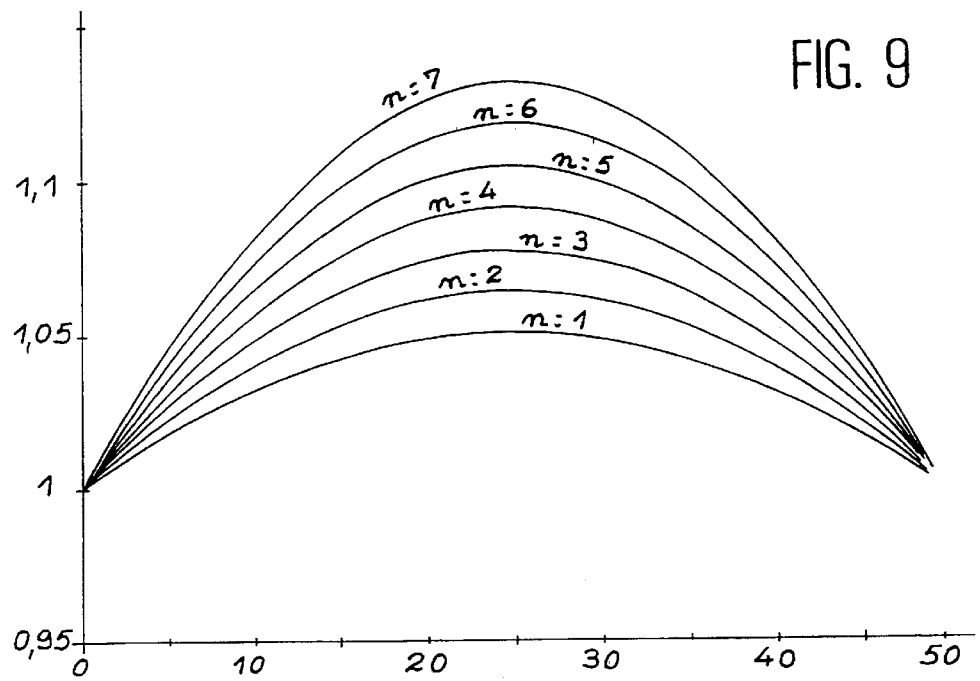
FIGS. 9 to 20 Graphs showing the uniformity of a deposit at different points of a substrate, for variable emission indices and conditions.
Figure 10:
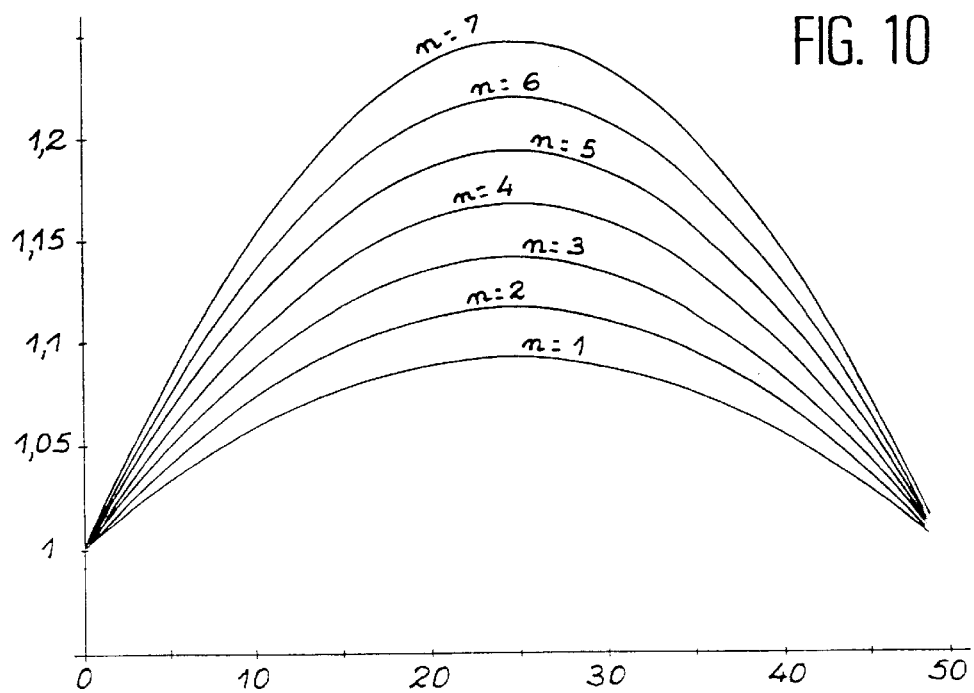
Figure 11:
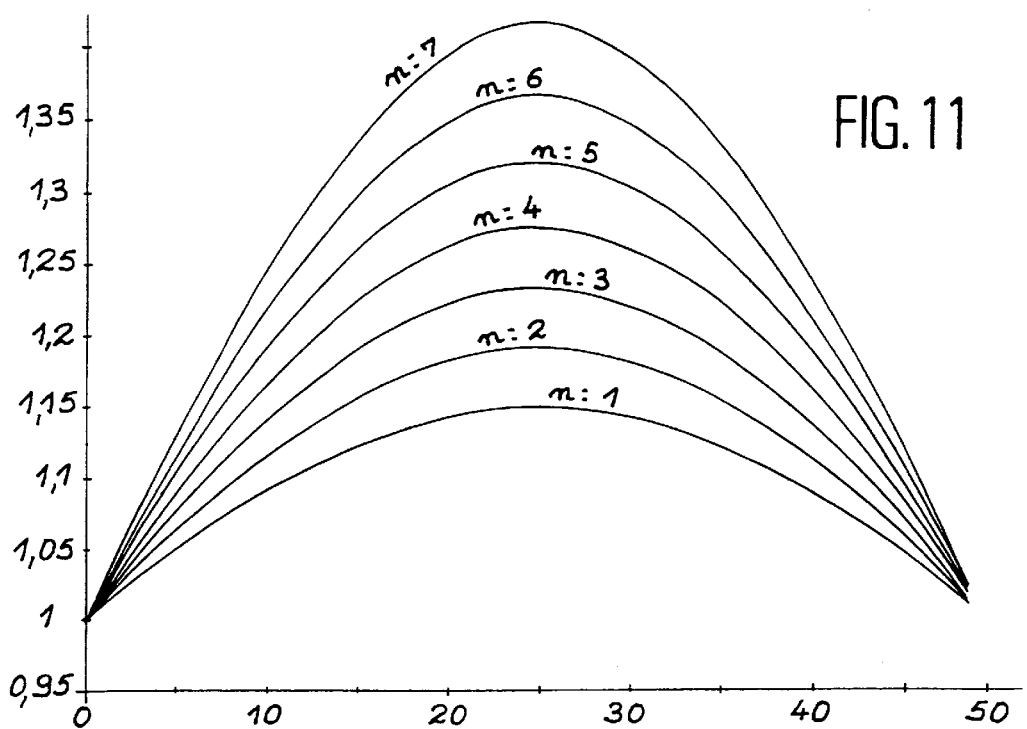
Figure 12:
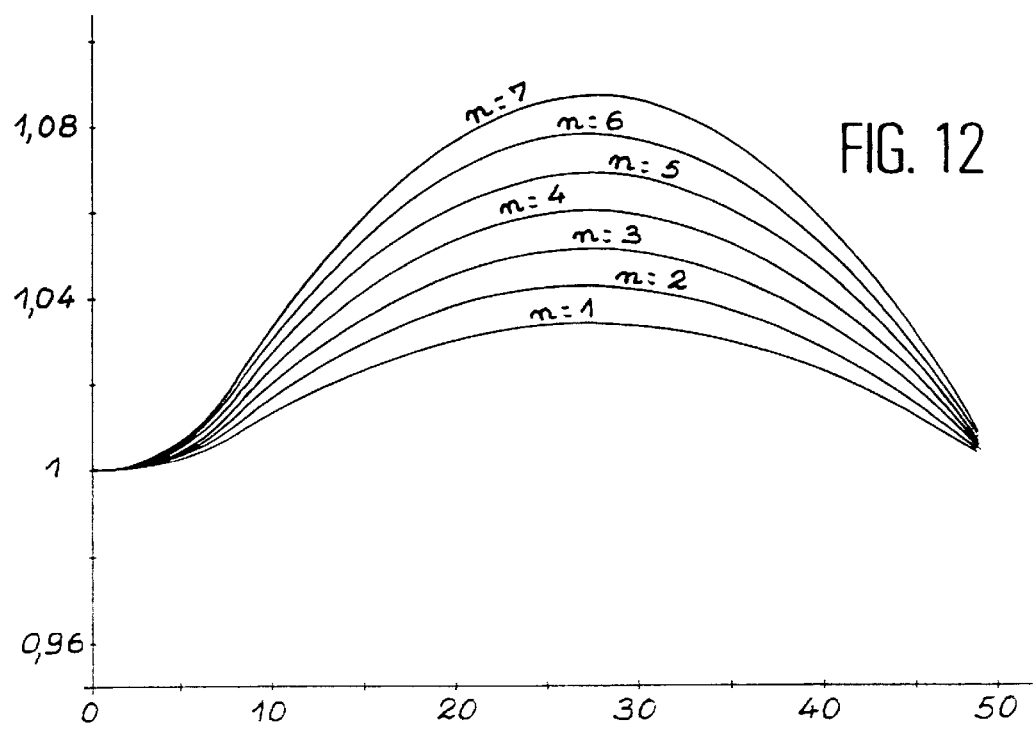
Figure 13:
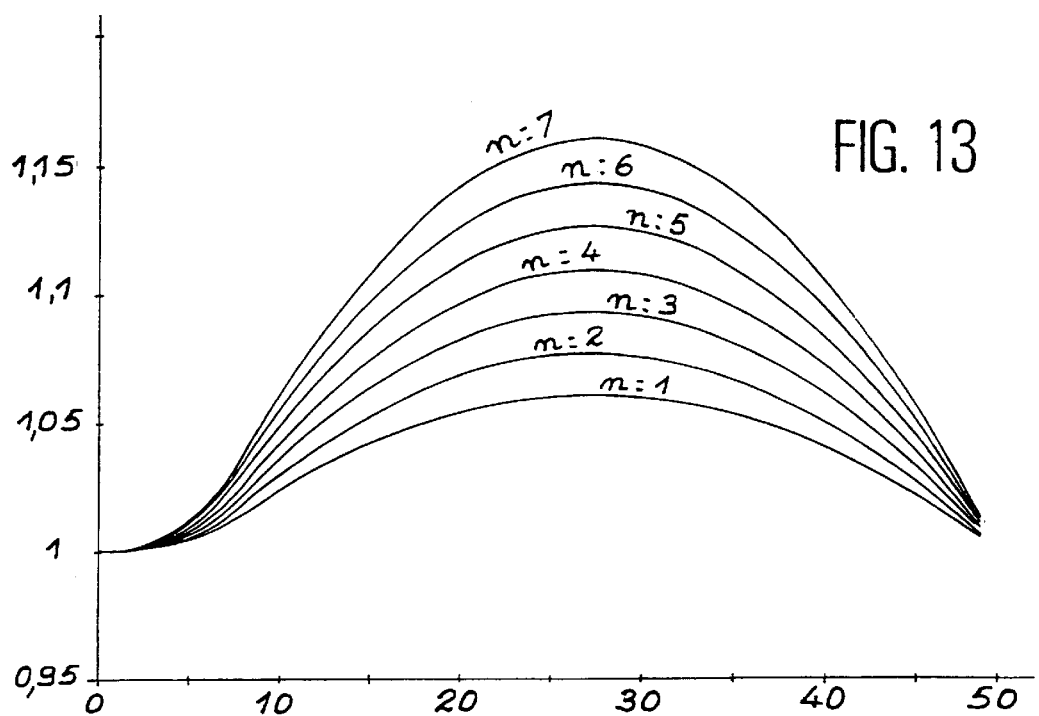
Figure 14:
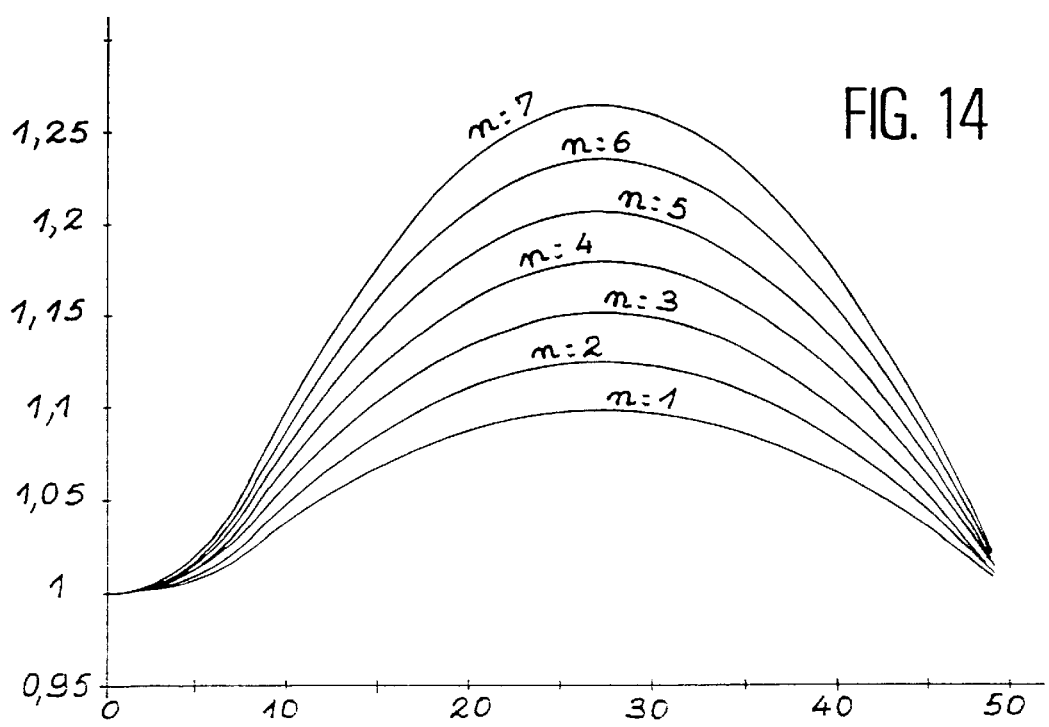
Figure 15:
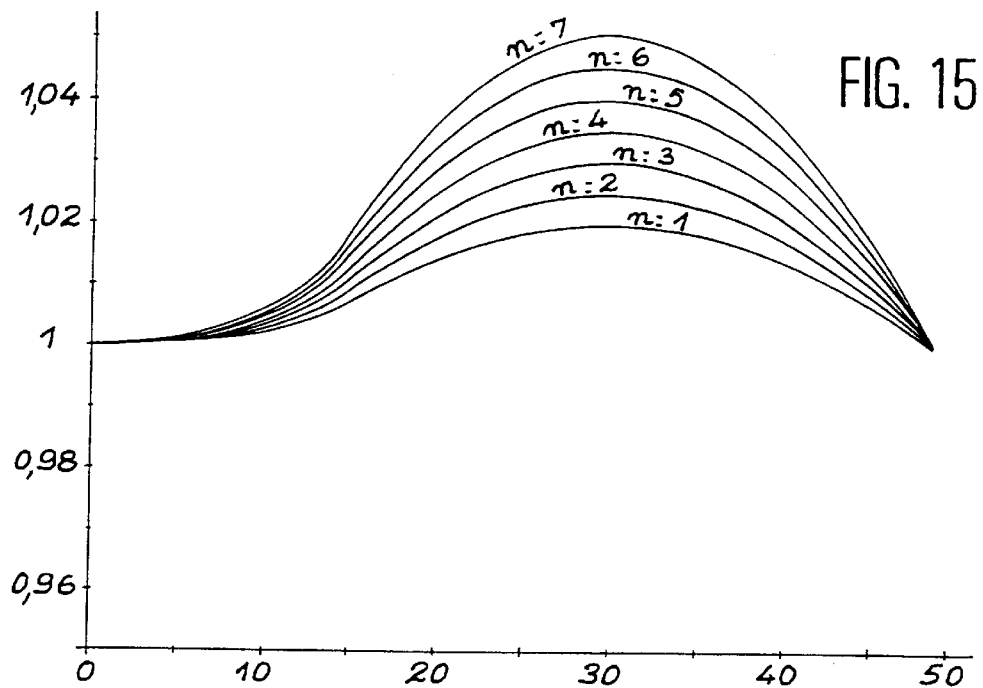
Figure 16:
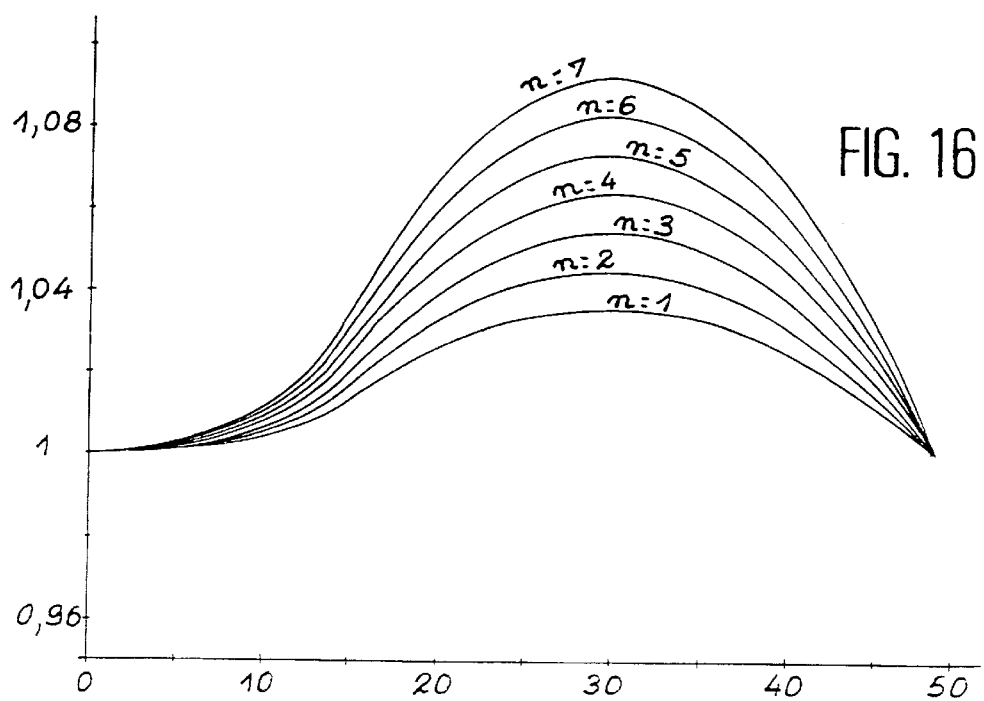
Figure 17:
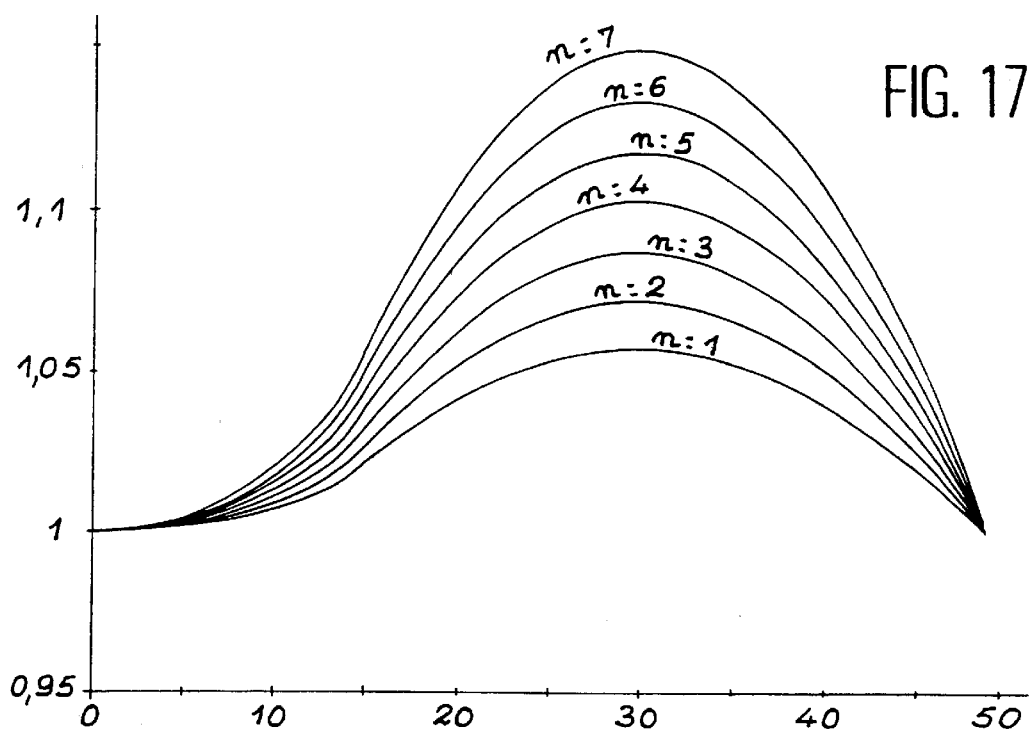
Figure 18:
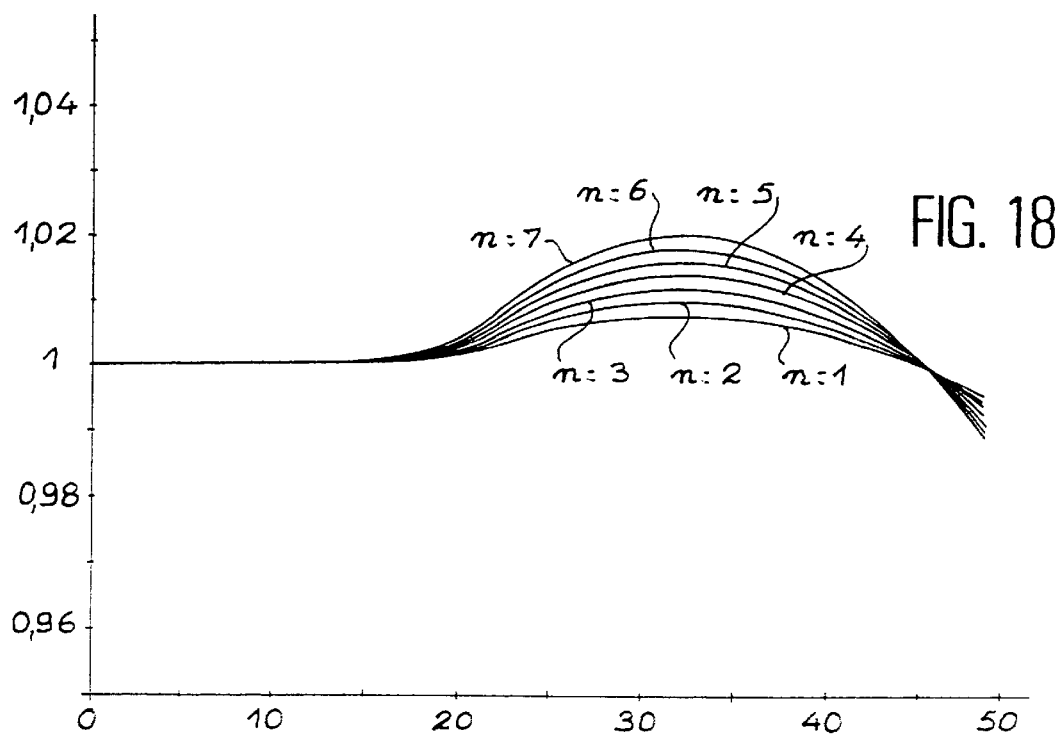
Figure 19:
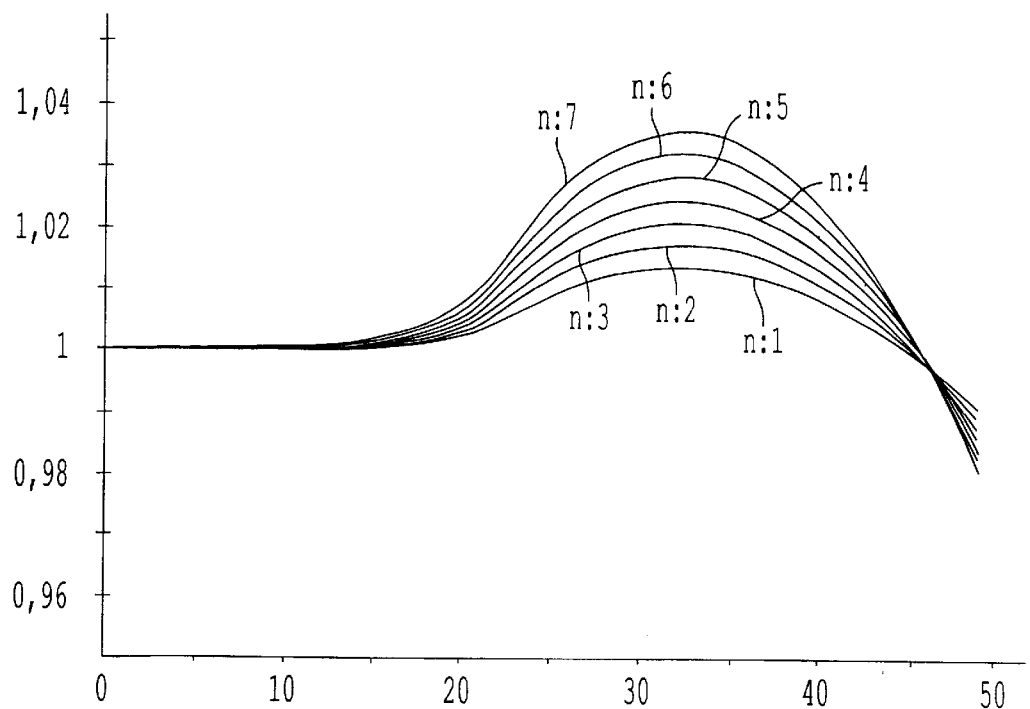
Figure 20:
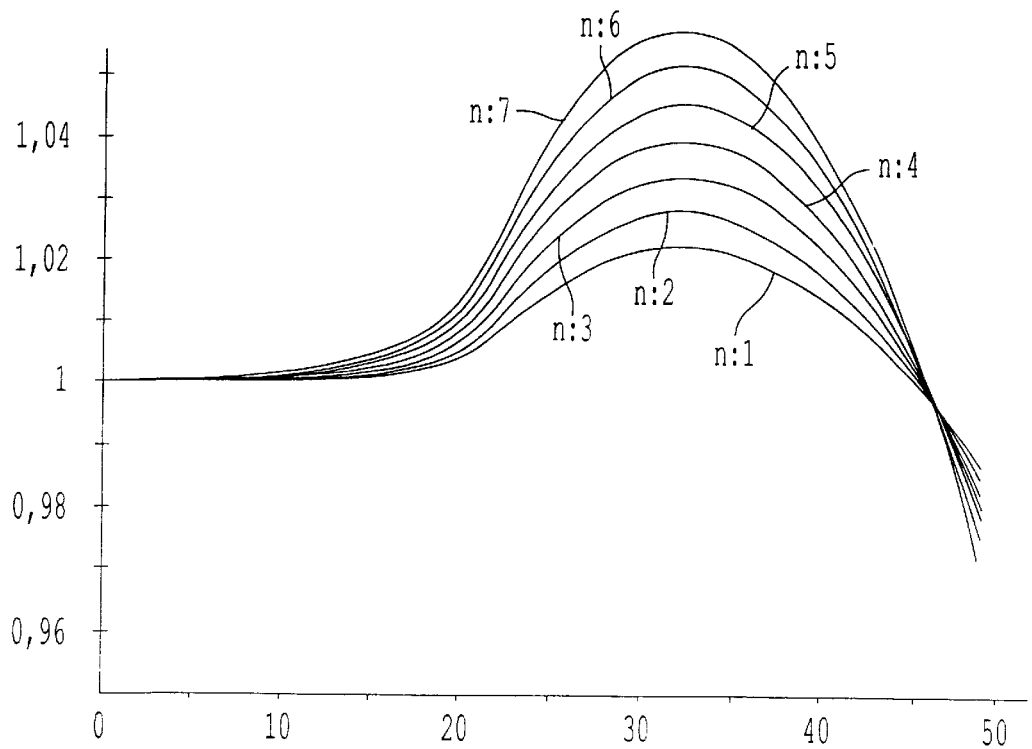

FIGS. 9 to 11 correspond to a stationary substrate and are used as a comparison reference.

The different geometrical parameters (source-substrate distance, maximum incidence angle of the vapour on the substrate, distance OC) are given for each graph in the following table I.

TABLE I

| FIGS. | h (cm) | θ (°) | OC (cm) | Uniformity n = 4, % |
|---|---|---|---|---|
| 9 | 157 | 9° | 0 | ±4.5 |
| 10 | 117 | 12° | 0 | ±8.5 |
| 11 | 92 | 15° | 0 | ±13.5 |
| 12 | 173 | 9° | 5 | ±3 |
| 13 | 129 | 12° | 5 | ±5.5 |
| 14 | 102 | 15° | 5 | ±9 |
| 15 | 188 | 9° | 10 | ±1.75 |
| 16 | 140 | 12° | 10 | ±3.1 |
| 17 | 111 | 15° | 10 | ±5 |
| 18 | 204 | 9° | 15 | ±0.75 |
| 19 | 145 | 12° | 15 | ±1.25 |
| 20 | 120 | 15° | 15 | ±2 |

The final column of the table (uniformity, n=4) makes it possible to compare the results obtained in the different cases for n=4. It is pointed out that in all cases the uniformity remains better than ±9% with OC≧5 cm. This uniformity improves significantly when OC increases. However it is necessary to increase the height h of the system and obviously its width.

Figure 4:
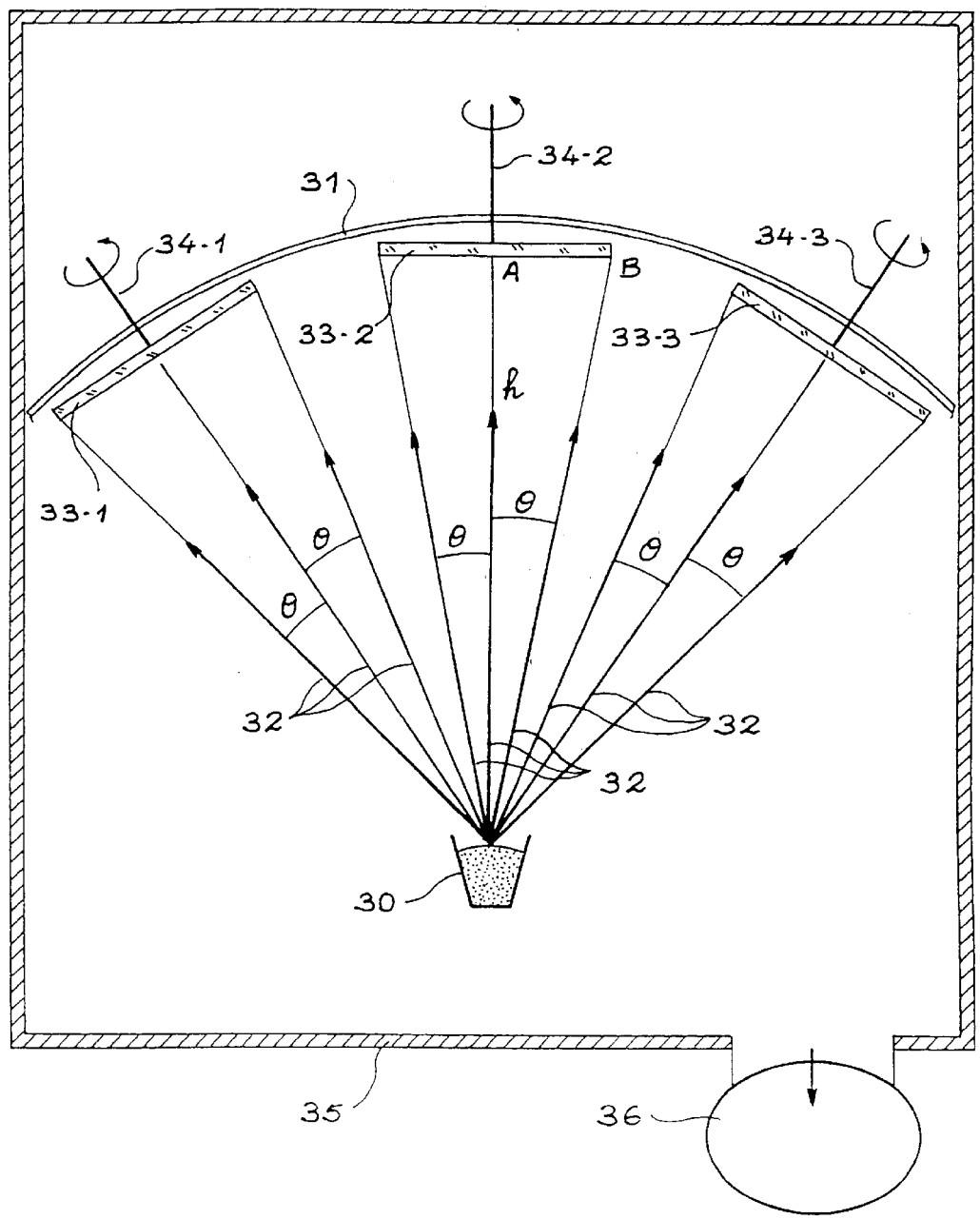
FIG. 4 A prior art evaporation apparatus.

Moreover, in all cases, the system height remains small compared with the 3.16 m of the prior art system (FIG. 4), a value which was calculated in the introduction to the present specification. The value of h varies from 1 to 2 m in the examples given, as a function of the configuration (angle θ and distance OC). This height range (1 to 2 meters) is quite acceptable to the expert, the limit being at around a height of 2 m. It would obviously be preferable to reduce the height to the greatest possible extent, e.g. by accepting a greater tolerance with respect to the angle θ (e.g. up to 15°).

In all the above calculations, it has been considered that the four sources are completely identical. In the case of a rotary-translatory movement, this condition makes it possible to obtain very good uniformity characteristics. In the case of a planetary movement (double rotation of the substrate on itself and about the axis 102), said condition is less important.

With regards to the above-observed uniformities, they would be further improved in the case of a planetary movement. However, this would obviously be to the detriment of the lateral dimensions of the apparatus.

The present apparatus applies to all applications where it is wished to produce deposits on large surfaces, said deposits requiring either a good uniformity, or a deposit under a limited incidence, or both.

Figure 2:
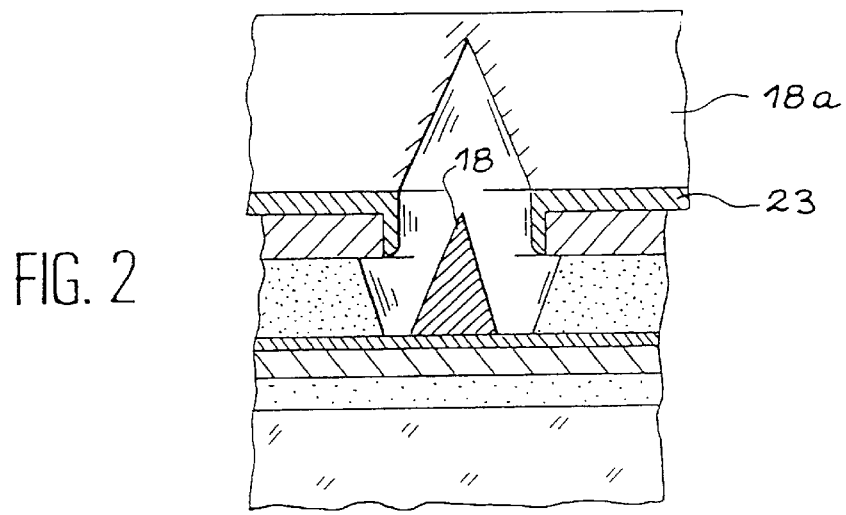
Figure 3:
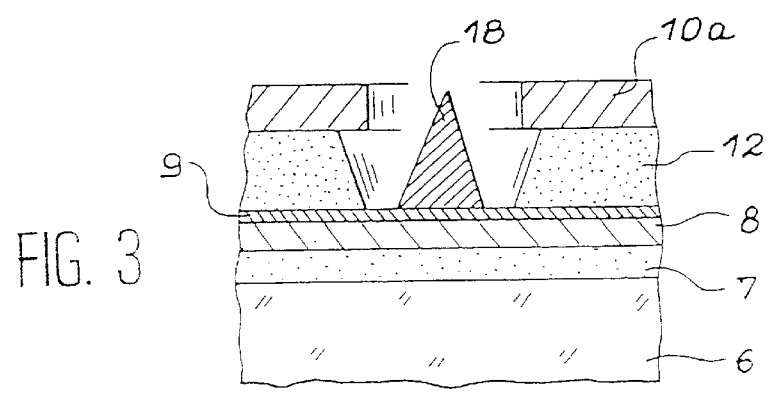

It is firstly possible to produce deposits of microtips for producing electron sources, e.g. a source like that described hereinbefore in conjunction with FIGS. 1 to 3.

The invention also relates to a process for producing deposits on large surfaces and consisting of introducing the surface or substrate into an apparatus according to the invention and as described hereinbefore. In the case where it is wished to produce a microtip electron source, e.g. for flat screens, into the evaporation apparatus is introduced a substrate having the structure described in conjunction with FIG. 1.

Other applications can be envisaged, for producing mirrors and also for optical or mechanical treatments.

What is claimed is:

1. An apparatus for depositing a material by evaporation on a substrate, comprising:
    an enclosure having at least one internal wall dividing said enclosure into at least two enclosure compartments;
    an evaporation source in each said enclosure compartments of said enclosure, and
    a substrate holder positioned to hold a substrate at a side of said enclosure such that the substrate is simultaneously exposed to vapor from more than one of said enclosure compartments,
    wherein said substrate holder is positioned to hold the substrate such that said at least one internal wall intercepts a portion of a first vapor from a first one of said vapor sources thereby substantially preventing said portion of said first vapor from reaching a second portion of the substrate, and
    wherein said at least one internal wall intercepts a portion of a second vapor from the second one of said vapor sources thereby substantially preventing said portion of said second vapor from reaching a first portion of the substrate.

2. The apparatus according to claim 1, wherein said at least one internal wall is vertical.

3. The apparatus according to claim 1, wherein said at least one internal wall has a wall thickness that decreases as it approaches said vapor-emitting side of said enclosure.

4. The apparatus according to claim 1, wherein said enclosure compartments defined by said at least one internal wall and at least one external wall of said enclosure are substantially cone-shaped with an open cone base.

5. The apparatus according to claim 1, wherein said substrate holder further comprises:
    a mover configured to move said substrate and to pass different portions of said substrate in front of different said enclosure compartments.

6. The apparatus according to claim 5, wherein said mover is configured to produce at least one of rotary movements and translatory movements in a single plane.

7. The apparatus according to claim 5, wherein said mover is configured to produce a planetary rotation movement of said substrate.

8. The apparatus according to claim 5, wherein said mover is configured to produce a rotary/translatory movement of said substrate.

9. The apparatus according to claim 8, wherein said mover comprises:
    a fixed sprocket; and
    two nested gears configured to rotate in the same plane and about said fixed sprocket.

10. The apparatus according to claim 8, wherein said mover comprises:
    a fixed sprocket;
    a gear kept at a constant distance from said fixed sprocket; and
    a toothed belt surrounding said fixed sprocket and said gear.

11. The apparatus according to claim 5, further comprising:
    an axis of symmetry of each of said at least one enclosure compartments substantially perpendicular to said substrate, wherein each said evaporation source is placed along said axis of symmetry.

12. A method of depositing a material by evaporation on a substrate, comprising the steps of:
    positioning a vapor source in each of at least two enclosure compartments in an enclosure having at least one internal wall dividing the enclosure into said at least two enclosure compartments;
    positioning a substrate relative to said enclosure such that the substrate is simultaneously exposed to a vapor from more than one of said vapor sources; and permitting the vapors from at least two of said vapor sources to simultaneously deposit on said substrate, wherein said substrate is positioned such that said at least one internal wall intercepts a first portion of vapor from a first one of said vapor sources thereby substantially preventing said first portion of vapor from reaching a second portion of the substrate, and wherein said at least one internal wall intercepts a second portion of vapor from the second one of said vapor sources thereby substantially preventing said second portion of vapor from reaching a first portion of the substrate.

13. The method of claim 12, further comprising:

moving said substrate to pass different portions of said substrate in front of different said enclosure compartments.

14. The method of claim 13, wherein said moving step further comprises:

producing a planetary rotation movement of said substrate.

15. The method of claim 13, wherein said moving step further comprises:

rotating said substrate in a single plane; and translating said substrate in said single plane.

16. The method of claim 13, wherein said positioning a substrate step further comprises:

placing said vapor source along an axis of symmetry substantially perpendicular to said substrate of each of said at least one enclosure compartments.

17. An apparatus for depositing a material by evaporation on a substrate, comprising:

an enclosure in which are placed plural material evaporation sources;

means for maintaining directivity of vapors emitted by said evaporation sources over the entire surface of the substrate during evaporation, said means for maintaining directivity being formed by walls or covers defining compartments within said enclosure, with each evaporation source being located within a compartment;

means for moving a substrate so as to pass different portions of the substrate successively in front of different evaporation sources, said moving means configured for producing, singularly or in combination, rotary or translatory movements in one plane, providing a rotary-translatory movement of the substrate, and wherein a system having two nested gears rotating in the same plane and about a fixer sprocket provides said rotary-translatory movement.

18. An apparatus for depositing a material by evaporation on a substrate, comprising:

an enclosure in which are placed plural material evaporation sources;

means for maintaining directivity of the vapors emitted by said sources over the entire surface of the substrate, during evaporation, said means for maintaining the directivity being formed by walls or covers defining compartments within said enclosure, with each evaporation source being located within a compartment;

means for moving a substrate so as to pass different portions of the substrate successively in front of different evaporation sources, said moving means configured for producing, singularly or in combination, rotary or translatory movements in one plane, providing a rotary-translatory movement of the substrate, and wherein a gear kept at a constant distance from a fixed sprocket, a toothed belt, or a chain surrounding a fixed sprocket and a gear provides said rotary-translatory movement.

* * * * *